(12) United States Patent
Sakaida et al.

(10) Patent No.: US 12,027,754 B2
(45) Date of Patent: Jul. 2, 2024

(54) ANTENNA SUBSTRATE, ANTENNA MODULE, AND METHOD OF MANUFACTURING ANTENNA SUBSTRATE

(71) Applicant: Murata Manufacturing Co., Ltd., Nagaokakyo (JP)

(72) Inventors: Shun Sakaida, Nagaokakyo (JP); Kengo Onaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 310 days.

(21) Appl. No.: 17/702,804

(22) Filed: Mar. 24, 2022

(65) Prior Publication Data

US 2022/0216591 A1 Jul. 7, 2022

Related U.S. Application Data

(63) Continuation of application No. PCT/JP2020/027834, filed on Jul. 17, 2020.

(30) Foreign Application Priority Data

Sep. 27, 2019 (JP) .................................. 2019-176991

(51) Int. Cl.
*H05K 1/02* (2006.01)
*C22F 1/00* (2006.01)
(Continued)

(52) U.S. Cl.
CPC ........... *H01Q 1/2283* (2013.01); *H01Q 1/243* (2013.01); *H01Q 21/20* (2013.01); *H05K 1/028* (2013.01); *H05K 1/09* (2013.01)

(58) Field of Classification Search
CPC ........ H05K 1/02; H05K 1/0218; H05K 1/028; H05K 1/09; H05K 3/046; H05K 3/46;
(Continued)

(56) References Cited

U.S. PATENT DOCUMENTS

| 6,185,108 | B1* | 2/2001 | Okura | ................. | H01H 13/702 |
| | | | | | 174/394 |
| 2007/0178232 | A1* | 8/2007 | Kodas | .................... | H05K 3/046 |
| | | | | | 427/383.1 |

(Continued)

FOREIGN PATENT DOCUMENTS

| JP | 2004-237596 A | 8/2004 |
| JP | 2006-40995 A | 2/2006 |

(Continued)

OTHER PUBLICATIONS

English translation of the Written Opinion mailed on Sep. 29, 2020, received for PCT Application PCT/JP2020/027834.

(Continued)

*Primary Examiner* — Xiaoliang Chen
(74) *Attorney, Agent, or Firm* — XSENSUS LLP (57) ABSTRACT

An antenna substrate includes a flat section where a radiating element is disposed, a flexible section disposed adjacent to the flat section, a first electrical conductor having one end portion connected to the radiating element inside the flat section, and a second electrical conductor having one end portion connected to the other end portion of the electrical conductor inside the flexible section. The average or median grain size in the extension direction of the first electrical conductor is larger than the average or median grain size in the extension direction of the second electrical conductor, and the average or median aspect ratio of the electrical conductor is larger than the average or median aspect ratio of the electrical conductor.

12 Claims, 7 Drawing Sheets

(51) Int. Cl.
*C22F 1/08* (2006.01)
*G06F 3/041* (2006.01)
*H01L 23/60* (2006.01)
*H01Q 1/22* (2006.01)
*H01Q 1/24* (2006.01)
*H01Q 21/20* (2006.01)
*H05K 1/09* (2006.01)
*H05K 3/46* (2006.01)

(58) Field of Classification Search
CPC .... H01Q 1/243; H01Q 1/2283; H01Q 9/0407; H01Q 21/0025; C22F 1/00; C22F 1/08; G06F 3/041; G06F 3/0412; G06F 3/04164; G06F 3/047; H01L 23/60; H01L 27/0248; H01L 27/13
USPC ............... 361/749, 758, 799, 807, 816, 818; 257/701; 174/394; 439/125
See application file for complete search history.

(56) References Cited

U.S. PATENT DOCUMENTS

| | | | | |
|---|---|---|---|---|
| 2009/0302456 | A1* | 12/2009 | Oikawa | H01L 23/60 257/E21.505 |
| 2017/0027514 | A1* | 2/2017 | Biederman | A61B 5/1451 |
| 2017/0213097 | A1* | 7/2017 | Vogel | G06V 10/147 |
| 2017/0279192 | A1* | 9/2017 | Taniguchi | H01Q 1/48 |
| 2018/0059845 | A1* | 3/2018 | Tada | G06F 3/0412 |
| 2019/0372229 | A1* | 12/2019 | Dalmia | H01Q 3/01 |
| 2021/0329784 | A1* | 10/2021 | Park | H05K 1/118 |

FOREIGN PATENT DOCUMENTS

| | | |
|---|---|---|
| JP | 2007-189261 A | 7/2007 |
| JP | 2009-111203 A | 5/2009 |
| JP | 2014-214376 A | 11/2014 |
| JP | 2019-4241 A | 1/2019 |
| WO | 2019/026595 A1 | 2/2019 |

OTHER PUBLICATIONS

International Search Report and Written Opinion mailed on Sep. 29, 2020, received for PCT Application PCT/JP2020/027834, Filed on Jul. 17, 2020, 9 pages including English Translation.

* cited by examiner

FIG.6          PREPARATION STEP

FIG.7     ANNEALING PROCESS
          (HEATING PROCESS) STEP

FIG.8          PRODUCED ARTICLE

ANTENNA SUBSTRATE, ANTENNA MODULE, AND METHOD OF MANUFACTURING ANTENNA SUBSTRATE

CROSS-REFERENCE TO RELATED APPLICATIONS

The present application is a continuation application of International Patent Application No. PCT/JP2020/027834, filed Jul. 17, 2020, which claims priority to Japanese Patent Application No. 2019-176991, filed Sep. 27, 2019, the entire contents of each of which being incorporated herein by reference.

TECHNICAL FIELD

The present disclosure relates to an antenna substrate having a flexible section, an antenna module including the antenna substrate, and a method of manufacturing the antenna substrate.

BACKGROUND ART

International Publication No. 2019/026595 discloses an antenna module including a power fed component (RFIC) and an antenna substrate. The antenna substrate includes a first flat section where the power fed component (RFIC) is mounted, a second flat section where an antenna element is mounted, a flexible section having flexibility and disposed between the first flat section and the second flat section, and a conductor wire that extends in an in-plane direction inside the first flat section, the second flat section, and the flexible section and connects the power fed component and the antenna element to each other.

In the antenna module, the first flat section and the second flat section are disposed at positions so as to be perpendicular to each other. The flexible section is disposed in a bent state so that the first flat section and the second flat section are connected to each other with the first flat section and the second flat section disposed at perpendicular positions to each other.

CITATION LIST

Patent Document

Patent Document 1: International Publication No. 2019/026595

SUMMARY

Technical Problems

In general, a conductor wire used for antenna substrates is composed of electrolytic copper foil having a polycrystalline structure. Electrolytic copper foil is manufactured by immersing a polarized drum having a mirror-like surface in an electrolytic solution so as to cause copper ions contained in the electrolytic solution to be deposited on the surface of the polarized drum utilizing the principle of electroplating to form copper foil, and then removing the copper foil from the surface of the polarized drum and winding the copper foil up once the thickness of the copper foil has reached a target value. Electrolytic copper foil has high dimensional accuracy and is suitable for use in antenna substrates requiring impedance adjustment.

On the other hand, electrolytic copper foil is characterized as having isotropic grains and a small grain size. Therefore, as recognized by the present inventors, if electrolytic copper foil is used as the material of a conductor wire disposed in a flexible section of an antenna substrate, bending stress generated when bending the flexible section is likely to cause cracks to progress in the thickness direction of the conductor wire, and there is concern that the conductor wire may break in some cases.

The present disclosure has been made in order to solve the above-described problem, as well as other problems, and it is an object thereof to ensure bending resistance of a conductor wire (or more generally an electrical conductor, which in selected embodiments are also a wire) disposed in a flexible section while suppressing variations in antenna characteristics in an antenna substrate having a flat section where an antenna element is disposed and a flexible section where a conductor wire connected to the antenna element is disposed.

Solutions to Problems

An antenna substrate according to the present disclosure is an antenna substrate having an antenna element. The antenna substrate includes a flat section which has a plate shape and in which the antenna element is disposed, a flexible section having a substantially uniform thickness that is shorter in width than length, the flexible section disposed adjacent to the flat section, and having flexibility, being disposed adjacent to the flat section, and having flexibility, a first electrical conductor that extends along an in-plane direction of the flat section and inside the flat section, the first electrical conductor has one end portion thereof connected to the antenna element, and has a polycrystalline structure. The second electrical conductor that extends along an in-plane direction of the flexible section and is disposed inside the flexible section, the second electrical conductor has one end portion thereof connected to another end portion of the first electrical conductor, and has a polycrystalline structure. An average or median particle size in an extension direction of the second electrical conductor is larger than an average or median particle size in an extension direction of the first electrical conductor, and an average or median value of a ratio of a particle size in the extension direction of the second electrical conductor to a particle size in a thickness direction of the second electrical conductor is larger than an average or median value of a ratio of a particle size in the extension direction of the first electrical conductor to a particle size in a thickness direction of the first electrical conductor.

In the above-described antenna substrate, the average or median particle size in the extension direction of the second conductor wire in the flexible section is larger than the average or median particle size in the extension direction of the first conductor wire in the flat section. In addition, the average or median aspect ratio (ratio of particle size in extension direction to particle size in thickness direction) of the second conductor wire is larger than the average or median aspect ratio of the first conductor wire. With this configuration, even if minute cracks are generated in the second conductor wire when the flexible section is bent, the cracks are unlikely to progress in the thickness direction of the second conductor wire and preventing the second conductor wire from electrically breaking can be made easier. On the other hand, electrolytic copper foil, which has a particle structure that is small in size and isotropic and has good dimensional accuracy, can be used as the material for the first conductor wire of the flat section. As a result, since variations in the length of the first conductor wire can be suppressed, variations in the antenna characteristics (for example, shifting of the frequency band in the reflection characteristics) can be reduced. As a result, the bending resistance of the second conductor wire disposed in the flexible section can be ensured while suppressing variations in the antenna characteristics.

A method of manufacturing an antenna substrate according to the present disclosure includes forming a first substrate with an electrical conductor therein, the electrical conductor comprising an electrolytic copper foil that has one end portion thereof connected to an antenna element, and producing a second substrate including performing an annealing process in which a specific part of the first substrate prepared is heated while being pressed so as to cause particles of the electrical conductor in the specific part to grow. In the second substrate, an average or median particle size in an extension direction of the electrical conductor in the specific part is larger than an average or median particle size in the extension direction of the electrical conductor in a part other than the specific part, and an average or median value of a ratio of a particle size in the extension direction of the electrical conductor in the specific part to a particle size in a thickness direction of the electrical conductor in the specific part is larger than an average or median value of a ratio of a particle size in the extension direction of the electrical conductor in the part other than the specific part to a particle size in the thickness direction of the electrical conductor in the part other than the specific part.

In the second substrate produced using the above-described manufacturing method, the average or median particle size in the extension direction of the conductor wire in the specific part (hereafter, "second conductor wire") is larger than the average or median particle size in the extension direction of the conductor wire in a part other than the specific part (hereafter, "first conductor wire"). In addition, the average or median aspect ratio of the first conductor wire is larger than the average or median aspect ratio of the second conductor wire. Therefore, even if minute cracks are generated in the second conductor wire when the specific part is bent, the cracks are unlikely to progress in the thickness direction of the second conductor wire and preventing the second conductor wire from electrically breaking can be made easier. On the other hand, electrolytic copper foil, which has a particle structure that is small in size and isotropic and has good dimensional accuracy, can be used as the material for the first conductor wire. As a result, since variations in the length of the first conductor wire can be suppressed, variations in the antenna characteristics (for example, shifting of the frequency band in the reflection characteristics) can be reduced. As a result, the bending resistance of the second conductor wire disposed in the specific part can be ensured while suppressing variations in the antenna characteristics.

Advantageous Effects

According to the present disclosure, bending resistance of a conductor wire disposed in a flexible section can be ensured while suppressing variations in antenna characteristics in an antenna substrate having a flat section where an antenna element is disposed and a flexible section where a conductor wire connected to the antenna element is disposed.

DESCRIPTION OF EMBODIMENTS

Hereafter, embodiments of the present disclosure will be described in detail while referring to the drawings. In the figures, identical or equivalent parts are denoted by the same symbols and repeated description thereof is omitted.

Basic Configuration of Communication Device

Figure 1:
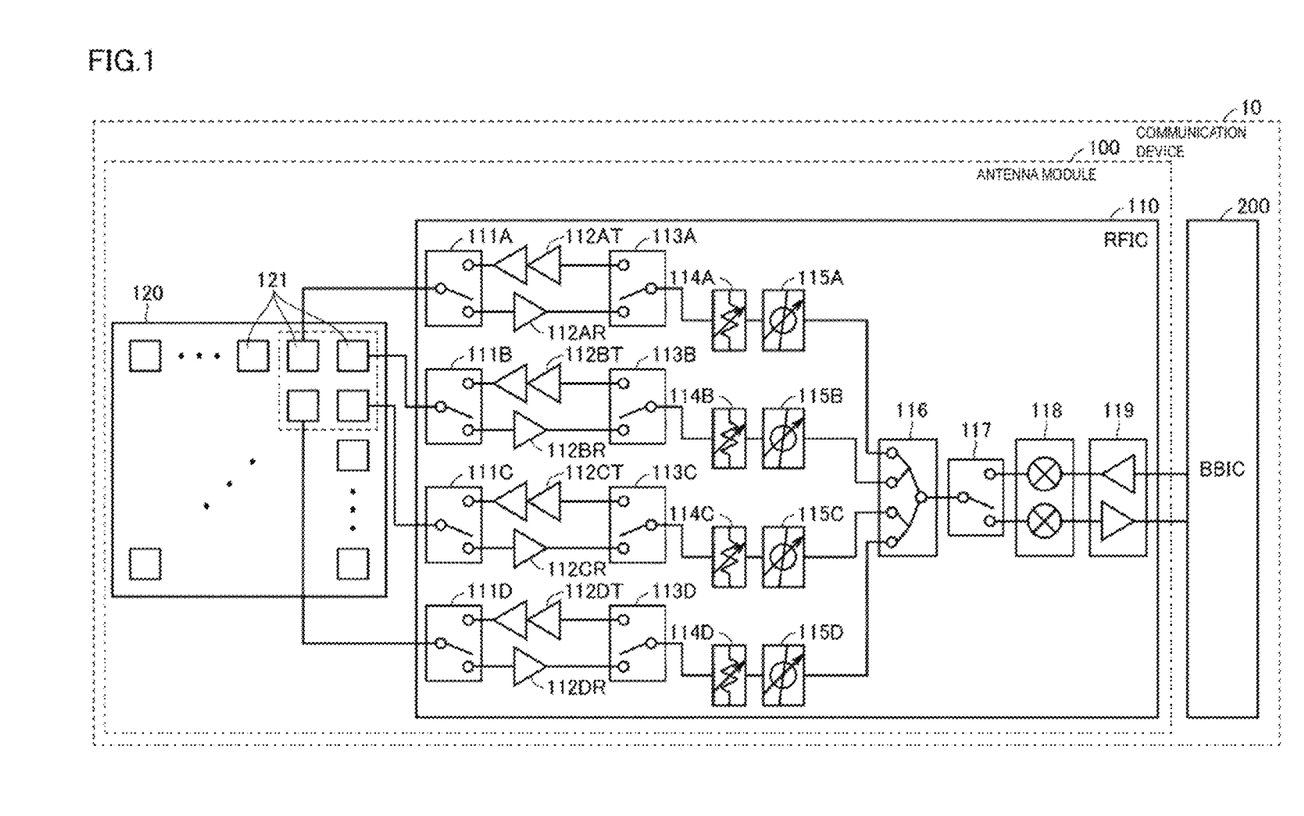
FIG. 1 is an example of a block diagram of a communication device in which an antenna substrate is used.

FIG. 1 is an example of a block diagram of a communication device 10 in which an antenna substrate 120 according to this embodiment is used. The communication device 10 is, for example, a mobile terminal such as a mobile phone, a smartphone, or a tablet, a personal computer having a communication function, and so forth.

Referring to FIG. 1, the communication device 10 includes an antenna module 100 including the antenna substrate 120 and a BBIC 200 that forms a baseband signal processing circuit. In addition to the antenna substrate 120, the antenna module 100 further includes an RFIC 110, which is an example of a power fed component. The communication device 10 up-converts a signal transmitted to the antenna module 100 from the BBIC 200 into a radio-frequency signal and radiates the radio-frequency signal from the antenna substrate 120 and the communication device 10 down-converts a radio-frequency signal received by the antenna substrate 120 and subjects the down-converted signal to processing using the BBIC 200.

The antenna substrate 120 includes a plurality of radiating elements 121. In FIG. 1, for simplicity of explanation, only the configurations corresponding to four radiating elements 121 among the plurality of radiating elements 121 included in the antenna substrate 120 are illustrated and the configurations corresponding to the rest of the radiating elements 121, which have the same configurations, are omitted. Note that although an example is illustrated in FIG. 1 in which the antenna substrate 120 includes a plurality of radiating elements 121 disposed in a two-dimensional array pattern, the arrangement of the radiating elements 121 does not necessarily have to be an array pattern and there do not necessarily have to be a plurality of radiating elements 121. In this embodiment, the radiating elements 121 are patch antennas substantially shaped like square flat plates.

The RFIC 110 includes switches 111A to 111D, 113A to 113D, and 117, power amplifiers 112AT to 112DT, low-noise amplifiers 112AR to 112DR, attenuators 114A to 114D, phase shifters 115A to 115D, a signal multiplexer/demultiplexer 116, a mixer 118, and an amplification circuit 119.

In the case where a radio-frequency signal is to be transmitted, the switches 111A to 111D and 113A to 113D are switched to the power amplifiers 112AT to 112DT and the switch 117 is connected to a transmission-side amplifier of the amplification circuit 119. In the case where a radio-frequency signal is to be received, the switches 111A to 111D and 113A to 113D are switched to the low-noise amplifiers 112AR to 112DR and the switch 117 is connected to a reception-side amplifier of the amplification circuit 119.

A signal transmitted from the BBIC 200 is amplified by the amplification circuit 119 and up-converted by the mixer 118. A transmission signal, which is the up-converted radio-frequency signal, is divided into four signals by the signal multiplexer/demultiplexer 116, and the respective four signals pass along four signal paths and are supplied to different radiating elements 121. In this case, the directivity of radio waves radiated from the antenna substrate 120 can be adjusted by the phases being individually adjusted of the phase shifters 115A to 115D disposed along the respective signal paths.

Reception signals, which are radio-frequency signals received by the radiating elements 121, pass along four different signal paths and are multiplexed by the signal multiplexer/demultiplexer 116. The multiplexed reception signal is down-converted by the mixer 118, amplified by the amplification circuit 119, and transmitted to the BBIC 200.

The RFIC 110 is, for example, formed as a single chip integrated circuit component including the above-described circuit configuration. Alternatively, devices (switches, power amplifiers, low-noise amplifiers, attenuators, and phase shifters) of the RFIC 110 that correspond to the individual radiating elements 121 may be formed as a single integrated chip component for each corresponding radiating element 121.

Arrangement and Configuration of Antenna Substrate

Figure 2:
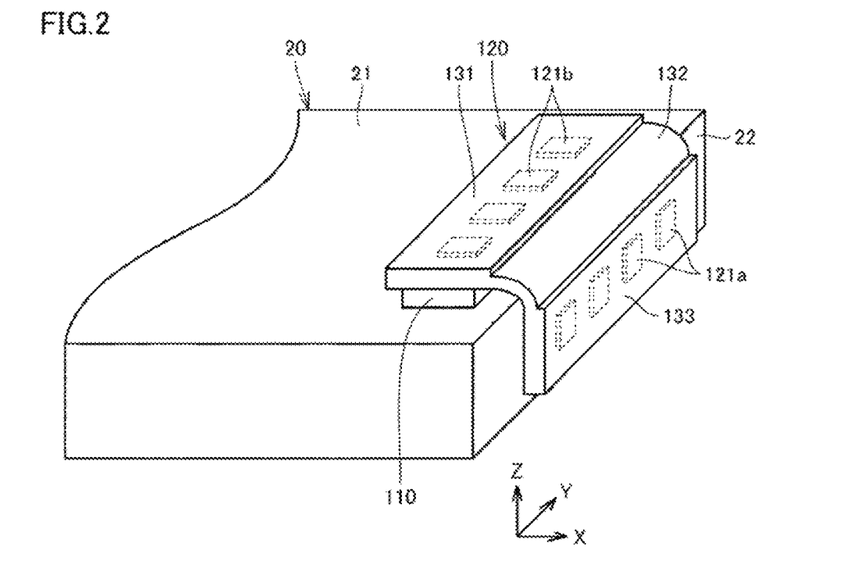
FIG. 2 is a diagram for describing the arrangement of an antenna substrate.

FIG. 2 is a diagram for describing the arrangement of the antenna substrate 120 in Embodiment 1. Referring to FIG. 2, the antenna substrate 120 includes plate-shaped flat sections 131 and 133 and a plate-shaped flexible section 132 that connects the flat section 131 and the flat section 133 to each other. The reference to "plate-shape" or "plate-shaped" as used herein corresponds with a structure that is has a substantially uniform thickness from one side to the other that is smaller than a length of the structure. Radiating elements 121a and 121b are respectively disposed in the flat sections 133 and 131.

The flat section 131 is disposed on one main surface 21 of a mounting substrate 20 with the RFIC 110 interposed therebetween. The flat section 131 extends along the main surface 21 of the mounting substrate 20. The flat section 133 extends along a side surface 22 of the mounting substrate 20. In other words, the flat section 131 and the flat section 133 are disposed at positions so as to be perpendicular to each other. Hereafter, a direction normal to the main surface 21 of the mounting substrate 20 is also referred to as a "Z-axis direction", a direction normal to the side surface 22 of the mounting substrate 20 is also referred to as an "X-axis direction", and a direction perpendicular to both the Z-axis direction and the X-axis direction is also referred to as a "Y-axis direction".

The radiating elements 121b of the flat section 131 are disposed so that radio waves are radiated therefrom in a direction normal to the main surface 21 (i.e., Z-axis direction). The radiating elements 121a of the flat section 133 are disposed so that radio waves are radiated therefrom in a direction normal to the side surface 22 (i.e., X-axis direction).

The flexible section 132 is disposed in a curved state in order to connect the first flat section 131 and the second flat section 133, which are disposed at perpendicular positions, to each other. As a result of connecting the two flat sections 131 and 133 to each other using the curved flexible section 132, radio waves can be radiated in two different directions. In view of the fact that the flexible section 132 is disposed in a curved state, the thickness of the flexible section 132 is set to a value smaller than the thicknesses of the flat sections 131 and 133.

The antenna substrate 120 (flat sections 131 and 133 and flexible section 132) is composed of a resin multilayer substrate formed by stacking sheets of a liquid crystal polymer (LCP) having thermoplasticity.

Figure 3:
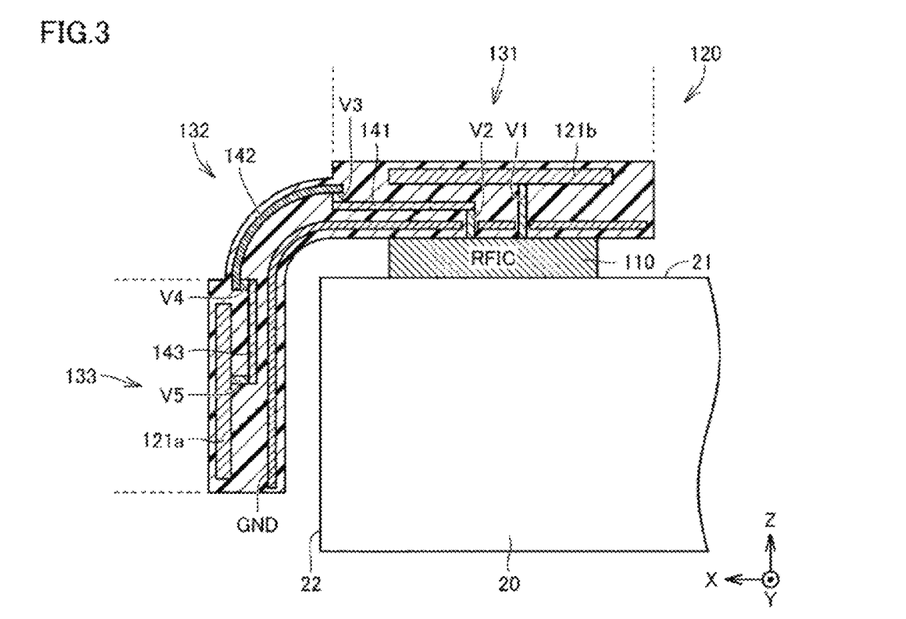
FIG. 3 is a transparent view (first view) of the inside of the antenna substrate.

FIG. 3 is a transparent view of the inside of the antenna substrate 120 from the positive Y-axis direction side in FIG. 2. The flat sections 131 and 133 and the flexible section 132 of the antenna substrate 120 all have a multilayer structure.

The radiating elements 121b, conductor wires 141, and a ground electrode GND are stacked in this order with prescribed intervals therebetween in the flat section 131. The radiating elements 121b extend in plate-like shapes along an in-plane direction of the flat section 131. The conductor wires 141 extend in line-like shapes along an in-plane direction of the flat section 131. The ground electrode GND extends in a plate-like shape along an in-plane direction of the flat section 131.

The radiating elements 121a, conductor wires 143, and a ground electrode GND are stacked in this order with prescribed intervals therebetween in the flat section 133. The radiating elements 121a extend in plate-like shapes along an in-plane direction of the flat section 133. The conductor wires 143 extend in line-like shapes along an in-plane direction of the flat section 133. The ground electrode GND extends in a plate-like shape along an in-plane direction of the flat section 133.

Conductor wires 142 and a ground electrode GND are stacked in this order with a prescribed interval therebetween in the flexible section 132. The conductor wires 142 extend in line-like shapes along an in-plane direction of the flexible section 132 such that a distance from an outer edge of the conductor wires 142 to an outer edge of the flexible section 132 is substantially the same along the curved portion of the flexible section 132. The ground electrode GND also extends in a plate-like shape along an in-plane direction of the flexible section 132 and remains a substantially constant distance away from in inner edge of the flexible section 132 along its inner radial curved portion. The ground electrodes GND are formed so as to be integrated with each other across the flat sections 131 and 133 and the flexible section 132.

In the flat section 131, the radiating elements 121b are connected to the RFIC 110 by vias V1. A radio-frequency signal is supplied from the RFIC 110 to the radiating elements 121b through the vias V1, and as a result, radio waves are radiated from the radiating elements 121b. One end portions of the conductor wires 141 are connected to the RFIC 110 through vias V2 and the other end portions of the conductor wires 141 are connected to one end portions of the conductor wires 142 through vias V3. The term "via" in this context is a vertical portion that extends in a normal direction from an edge surface. The via may be empty, or in the case of it serving as an electrical conductor, is at least partially occupied with an electrically conductive material.

The radiating elements 121a are connected to one end portions of the conductor wires 143 through vias V5 in the flat section 133. The other end portions of the conductor wires 143 are connected to the other end portions of the conductor wires 142 through vias V4. In other words, the radiating elements 121a of the flat section 133 are connected to the RFIC 110 through the conductor wires 141 to 143 and the vias V2 to V5. A radio-frequency signal is supplied from the RFIC 110 to the radiating elements 121a through the conductor wires 141 to 143 and vias V2 to V5, and as a result, radio waves are radiated from the radiating elements 121a.

The flexible section 132 is disposed in a curved state as described above. Therefore, bending stress acts on the flexible section 132 when the flexible section 132 is bent from a flat state to a curved state.

Grain Structures of Conductor Wires

Generally, conductor wires used inside a multilayer substrate are composed of electrolytic copper foil having a polycrystalline structure. Electrolytic copper foil is manufactured by immersing and rotating a polarized drum having a mirror-like surface in an electrolytic solution so as to cause copper ions contained in the electrolytic solution to be deposited on the surface of the polarized drum utilizing the principle of electroplating to form copper foil, and then removing the copper foil from the surface of the polarized drum and winding the copper foil up once the thickness of the copper foil has reached a target value. Electrolytic copper foil has high dimensional accuracy due to the manufacturing principles thereof and is suitable for use in antenna substrates requiring impedance adjustment.

On the other hand, the grains (particles) of electrolytic copper foil have characteristics of being small in size and having an isotropic structure. Therefore, if electrolytic copper foil is used as the material of the conductor wires 142 disposed in the flexible section 132, bending stress (in particular, tensile stress generated at the outer peripheral side of the bent part) generated when the flexible section 132 is bent is likely to cause cracks to progress in the thickness direction of the conductor wires 142, and there is concern that the conductor wires 142 may break in some cases.

Accordingly, in the antenna substrate 120 according to this embodiment, electrolytic copper foil having high dimensional accuracy is used as the material of the conductor wires 141 and 143 in the flat sections 131 and 133 where bending stress does not act. In contrast, rolled copper foil, rather than electrolytic copper foil, is used as the material of the conductor wires 142 in the flexible section 132 where bending stress may act.

Rolled copper foil is manufactured by repeatedly performing a rolling process in which the thickness of copper is reduced by passing copper material between rolling rollers and stretching the copper material until the thickness of the copper reaches a target value. Repeated performance of the rolling process causes the copper particles to grow in an extension direction, and therefore the grains of the rolled copper foil have characteristics of being larger in size and having an anisotropic structure that is longer in the extension direction compared to those before the rolling process.

Figure 4:
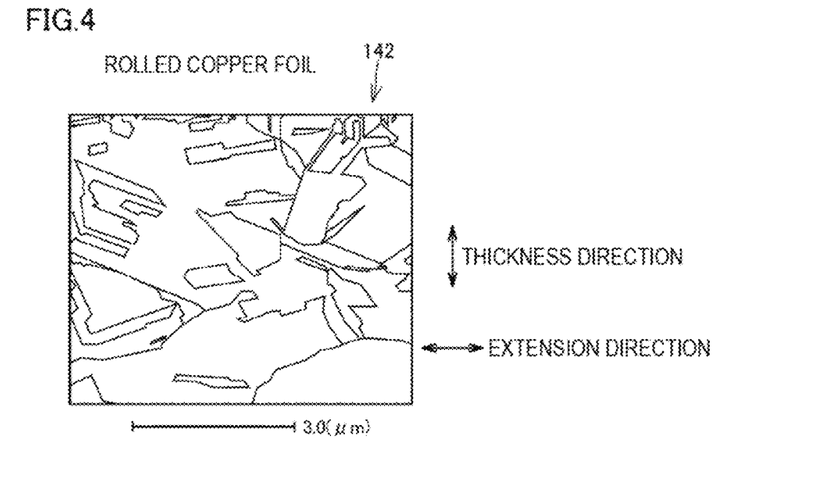
FIG. 4 is a diagram illustrating a cross section of a conductor wire (rolled copper foil) of a flexible section.
Figure 5:
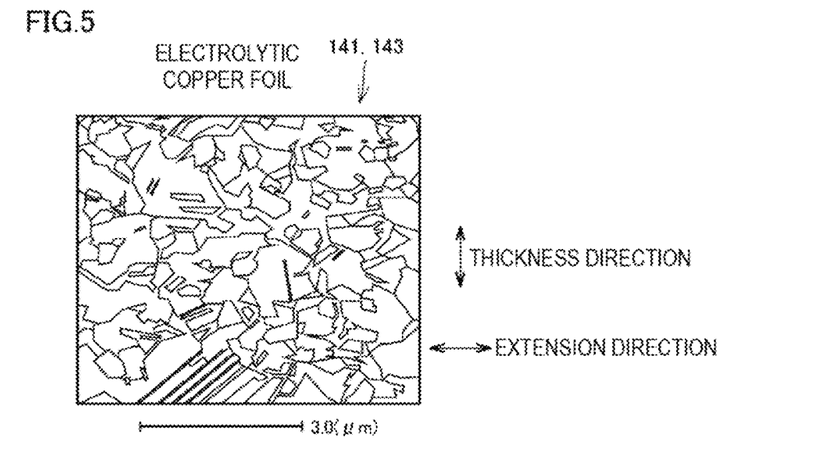
FIG. 5 is a diagram illustrating a cross section of a conductor wire (electrolytic copper foil) of a flat section.

FIG. 4 is a diagram illustrating a cross section of the conductor wires 142 (rolled copper foil) of the flexible section 132. FIG. 5 is a diagram illustrating a cross section of the conductor wires 141 or 143 (electrolytic copper foil) of the flat section 131 or 133. In FIGS. 4 and 5, the horizontal direction of the paper corresponds to the extension direction of the conductor wires and the vertical direction of the paper corresponds to the thickness direction of the conductor wires.

Rolled copper foil and electrolytic copper foil both have polycrystalline structures, but have different grain sizes and have different ratios of the grain size in the extension direction to the grain size in the thickness direction (hereafter, also referred to as "aspect ratio").

The grains of the conductor wires 142 (rolled copper foil) illustrated in FIG. 4 are large in size and have an anisotropic structure in which the grains are longer in the extension direction due to the rolling process causing the copper particles to grow in the extension direction. In contrast, the grains of the conductor wires 141 and 143 (electrolytic copper foil) illustrated in FIG. 5 are smaller in size and have an isotropic structure when compared to the grains of the conductor wires 142 (rolled copper foil) illustrated in FIG. 4.

The average or median grain size in the extension direction of the conductor wires 142 (rolled copper foil) illustrated in FIG. 4 is larger than the average or median grain size in the extension direction of the conductor wires 141 and 143 (electrolytic copper foil) illustrated in FIG. 5. In addition, the average or median aspect ratio of the conductor wires 142 (rolled copper foil) illustrated in FIG. 4 is larger than the average or median aspect ratio of the conductor wires 141 and 143 (electrolytic copper foil) illustrated in FIG. 5.

The size of each grain can be obtained by, for example, analyzing an image of the cross section of each conductor wire, identifying as each grain a part enclosed by the same boundary surface, and measuring the size of each identified grain in the thickness direction and extension direction. The average and median grain sizes and the average and median aspect ratios can be obtained by statistically processing the results of a plurality of grain size calculations.

In the conductor wires 142 (rolled copper foil) illustrated in FIG. 4, the average grain size in the extension direction is generally 2.0 μm to 4.0 μm and the average grain size in the thickness direction is generally 0.5 μm to 1.5 μm. In contrast, in the conductor wires 141 and 143 (electrolytic copper foil) illustrated in FIG. 5, the average grain size in the extension direction is generally 0.1 μm to 0.5 μm and the average grain size in the thickness direction is generally 0.1 μm to 0.5 μm.

By using rolled copper foil, which has a larger grain size and a larger aspect ratio than electrolytic copper foil, as the material for the conductor wires 142 of the flexible section 132, cracks can be made to progress more easily in the extension direction and less easily in the thickness direction even when the same bending stress is applied compared to the case where electrolytic copper foil is used. In other words, even if minute cracks are generated in the conductor wires 142 when bending the flexible section 132, progress of the cracks in the thickness direction of the conductor wires 142 can be suppressed and it can be made easier to prevent the conductor wires 142 from electrically breaking. As a result, bending resistance of the conductor wires 142 of the flexible section 132 can be ensured.

On the other hand, electrolytic copper foil, which has higher dimensional accuracy than rolled copper foil, is used as the material for the conductor wires 141 and 143 of the flat sections 131 and 133. Therefore, variations in the lengths of the conductor wires 141 and 143 can be suppressed compared to a case where rolled copper foil is used as the material for the conductor wires 141 and 143. As a result, since the dimensional accuracy of the total lengths of the conductor wires 141, 142, and 143 from the RFIC 110 to the radiating elements 121a is increased, variations in the antenna characteristics of the radiating elements 121a (for example, shifting of the frequency band in the reflection characteristics) can be reduced.

Furthermore, adhesion between the conductor wires 141 and 143 and the surrounding liquid crystal polymer substrate can be improved as a result of using electrolytic copper foil rather than rolled copper foil as the material of the conductor wires 141 and 143. In other words, since rolled copper foil is manufactured by stretching copper using rolling rollers, the surfaces of rolled copper foil tend to be rougher than the surfaces of electrolytic copper foil. In contrast, electrolytic copper foil is manufactured by deposition on the surface of a polarized drum having a mirror-like finish, and therefore the surfaces of electrolytic copper foil are smooth. Therefore, the strength of adhesion between the conductor wires 141 and 143 and the surrounding liquid crystal polymer substrate can be improved as a result of using electrolytic copper foil rather than rolled copper foil as the material of the conductor wires 141 and 143.

In addition, since electrolytic copper foil can generally be manufactured more cheaply than rolled copper foil, the cost of the antenna substrate 120 can also be reduced. In other words, by using rolled copper foil for the conductor wires 142 of the flexible section 132 where bending stress may act in order to ensure bending resistance and by using electrolytic copper foil, which is cheaper than rolled copper foil, for the conductor wires 141 and 143 of the flat sections 131 and 133 where bending stress will not act, the cost can be reduced compared to the case of using rolled copper foil for all of the conductor wires 141, 142, and 143.

As described above, the antenna substrate 120 according to this embodiment includes the plate-shaped flat section 133 where the radiating elements 121a are disposed, the plate-shaped flexible section 132 disposed adjacent to the flat section 133, the conductor wires 143 having one end portions connected to the radiating elements 121a inside the flat section 133, and the conductor wires 142 having one end portions connected to the other end portions of the conductor wires 143 inside the flexible section 132. Electrolytic copper foil is used as the material of the conductor wires 143 and rolled copper foil is used as the material of the conductor wires 142. The average or median grain size in the extension direction of the conductor wires 142 is larger than the average or median grain size in the extension direction of the conductor wires 143, and the average or median aspect ratio of the conductor wires 142 is larger than the average or median aspect ratio of the conductor wires 143.

Thus, bending resistance of the conductor wires 142 when bending the flexible section 132 can be ensured by using rolled copper foil, which has a larger grain size and a larger aspect ratio than electrolytic copper foil, as the material of the conductor wires 142 of the flexible section 132. On the other hand, since the dimensional accuracy of the total lengths of the conductor wires 141, 142, and 143 from the RFIC 110 to the radiating elements 121a is increased by using electrolytic copper foil, which has higher dimensional accuracy than rolled copper foil, as the material of the conductor wires 143 of the flat section 133, variations in the antenna characteristics of the radiating elements 121a can be reduced. As a result, in the antenna substrate 120 including the flat section 133 where the radiating elements 121a are disposed and the flexible section 132 where the conductor wires 142 connected to the radiating elements 121a are disposed, the bending resistance of the conductor wires 142 disposed in the flexible section 132 can be ensured while suppressing variations in antenna characteristics.

The radiating elements 121a, the flat section 133, the flexible section 132, the conductor wires 143, and the conductor wires 142 of this embodiment may respectively correspond to an "antenna element", a "flat section", a "flexible section", a "first conductor wire", and a "second conductor wire" of the present disclosure.

Regarding the grain structure of the ground electrodes GND, rolled copper foil is preferably used as the material of the ground electrode GND of the flexible section 132 and electrolytic copper foil is preferably used as the material of the ground electrodes GND of the flat sections 131 and 133 from the viewpoint of preventing cracks. On the other hand, electrolytic copper foil may be used as the materials of all the ground electrodes GND from the viewpoint of reducing cost.

MODIFICATIONS

Modification 1

The antenna substrate 120 according to the above-described embodiment has a configuration (hereafter, also referred to as "a characteristic configuration of the present disclosure") in which the average or median grain size and the average or median aspect ratio of the conductor wires 142 of the flexible section 132 are larger than the average or median grain size and the average or median aspect ratio of the conductor wires 141 and 143 of the flat sections 131 and 133. In the above-described embodiment, an example is described in which the antenna substrate 120 having the characteristic configuration of the present disclosure is manufactured by connecting the conductor wires 142 composed of rolled copper foil and the conductor wires 141 and 143 composed of electrolytic copper foil to each other using the vias V3 and V4.

In contrast, in this Modification 1, an antenna substrate 120B having the characteristic configuration of the present disclosure is manufactured by performing a preparation step and an annealing process (heating process) step described below in this order.

Figure 6:
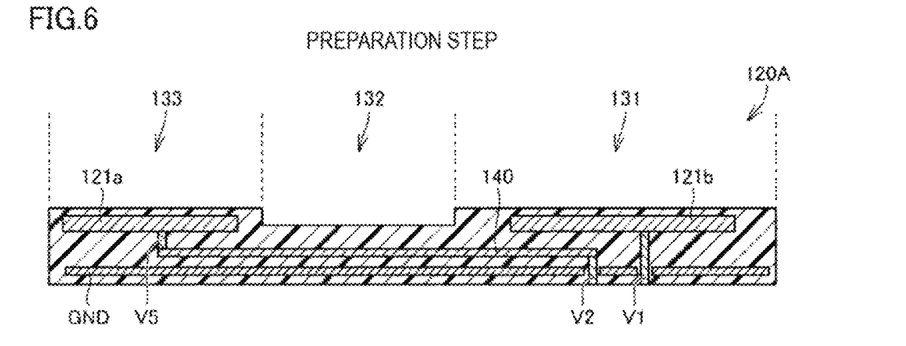
FIG. 6 is a diagram for describing a preparation step.
Figure 7:
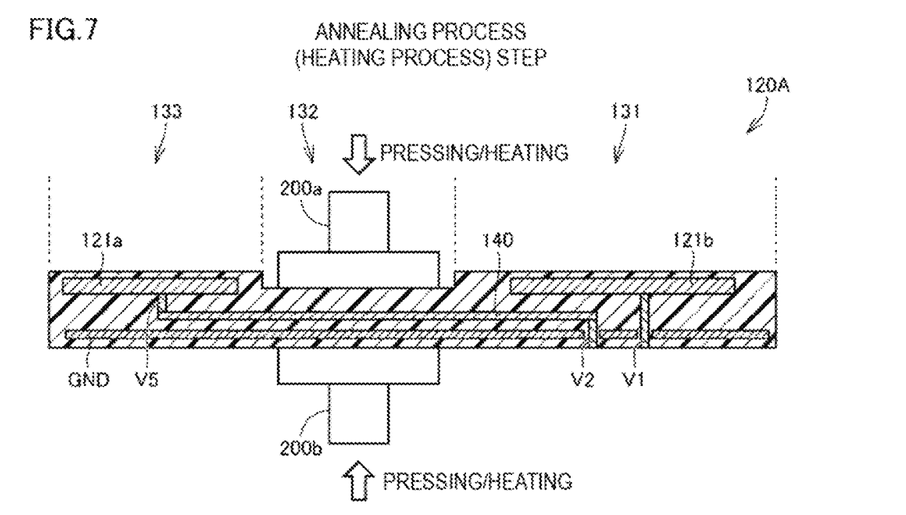
FIG. 7 is a diagram for describing an annealing process step.
Figure 8:
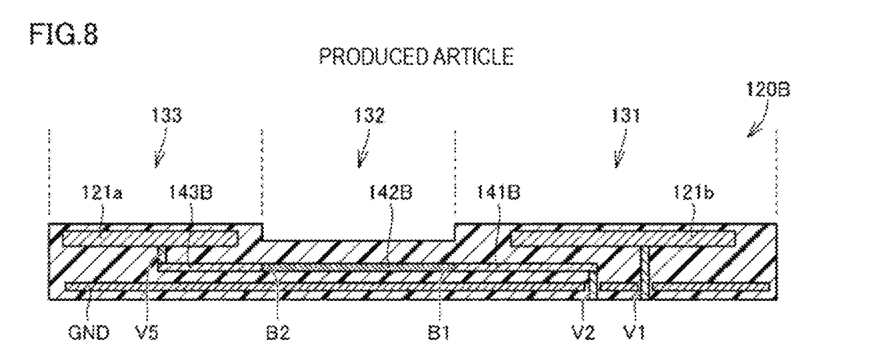
FIG. 8 is a diagram illustrating an antenna substrate produced by the annealing process step.

FIG. 6 is a diagram for describing a preparation step in Modification 1. FIG. 7 is a diagram for describing an annealing process step in Modification 1. FIG. 8 is a diagram illustrating the antenna substrate 120B produced by the annealing process step.

As illustrated in FIG. 6, an antenna substrate 120A is prepared in the preparation step. The antenna substrate 120A has a configuration in which the conductor wires 141, 142, and 143 and the vias V3 and V4 of the antenna substrate 120 described above are replaced with single conductor wires 140 composed of electrolytic copper foil.

As illustrated in FIG. 7, in the annealing process step, an annealing process is performed in which the flexible section 132 of the antenna substrate 120A prepared in the preparation step is heated while being pressed in the thickness direction by using manufacturing devices 200a and 200b, and as a result, the grains in the part of the conductor wirings 140 contained in the flexible section 132 are made to grow in the extension direction.

In the annealing process, the flexible section 132 of the antenna substrate 120A is heated at a prescribed temperature (for example, temperature greater than or equal to 230° C. and less than 300° C.) while being pressed at a prescribed pressure (for example, pressure less than or equal to 8.4

MPa) for a prescribed holding time (for example, time from 30 minutes to 3 hours). Although it is desirable to set the heating temperature to 230° C. or higher in order to grow (enlarge) the grain size, since melting and decomposition of the resin multilayer substrate, which is the base material of the antenna substrate 120A, occur at around 300° C., it is desirable to perform the annealing process after setting the holding time, pressure value, and heating temperature as appropriate. The heating is desirably performed for 1 hour at 250° C., more desirably for 30 minutes at 280° C., or for 2 to 3 hours at 230° C. in order to suppress damage to mounted components and so forth. If the antenna substrate 120A is a collective board manufactured by batch press stacking, the value of the pressure is preferably 8.4 MPa or less, as described above, taking into consideration the conditions during manufacturing and the fact that a local heating press is used.

The characteristic configuration of the present disclosure can be obtained by performing the above-described process on the flexible section 132 of the antenna substrate 120A. In other words, the average or median grain size and aspect ratio in the parts of the conductor wires 140 in the flexible section 132 are larger than the average or median grain size and aspect ratio in the parts of the conductor wires 140 in the flat sections 131 and 133. As a result, as illustrated in FIG. 8, in the antenna substrate 120B produced using the annealing process step, the parts of the conductor wires 140 in the flat sections 131 and 133 form conductor wires 141B and 143B composed of electrolytic copper foil and the parts of the conductor wires 140 in the flexible section 132 form conductor wires 142B having the same grain structure as rolled copper foil.

An example is illustrated in FIG. 8 in which a boundary part B1 between the conductor wires 142B and the conductor wires 141B and a boundary part between the flexible section 132 and the flat section 131 substantially coincide with each other, but these boundary parts may instead be shifted from each other to some extent. Similarly, an example is illustrated in FIG. 8 in which a boundary part B1 between the conductor wires 142B and the conductor wires 143B and a boundary part between the flexible section 132 and the flat section 133 substantially coincide with each other, but these boundary parts may instead be shifted from each other to some extent. In addition, the grain structures of the boundary parts B1 and B2 may gradually change from a grain structure equivalent to that of rolled copper foil to the grain structure of electrolytic copper foil from the region near the conductor wires 142B to the sides near the conductor wires 141B and 143B.

Figure 9:
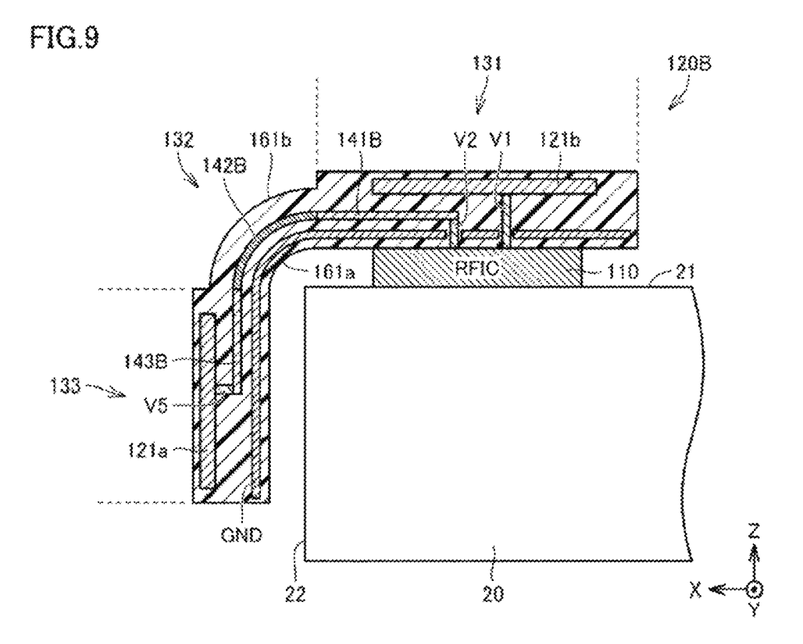
FIG. 9 is a diagram illustrating an antenna substrate produced by the annealing process step and mounted on a mounting substrate.

FIG. 9 is a diagram illustrating the antenna substrate 120B produced by the annealing process step according to Modification 1 mounted on the mounting substrate 20. In the antenna substrate 120B, as illustrated in FIG. 9, the conductor wires 142B in the flexible section 132 are formed so as to be integrated with the conductor wires 141B and 143B in the flat sections 131 and 133.

The grain structures of the conductor wires 141B and 142B of the flat sections 131 and 133 are the same as the grain structure of the electrolytic copper foil illustrated in FIG. 5. In contrast, the grain structure of the conductor wires 142B of the flexible section 132 is equivalent to the grain structure of the rolled copper foil illustrated in FIG. 4 as a result of the grains having been caused to grow in the extension direction by the annealing process. Thus, the bending resistance of the conductor wires 142B disposed in the flexible section 132 can be ensured while suppressing variations in antenna characteristics similarly to as in the above-described embodiment.

The "antenna substrate 120A", the "preparation step", the "annealing process", the "antenna substrate 120B", and the "annealing process step" of Modification 1 may respectively correspond to a "first substrate", a "step of preparing a first substrate", an "annealing process", a "second substrate", and a "step of producing a second substrate" of the present disclosure.

Modification 2

In the above-described antenna substrate 120 illustrated in FIG. 3, the flat sections 131 and 133 and the flexible section 132 are all composed solely of flexible substrates having thermoplasticity. However, at least either of the flat sections 131 and 133 may have a structure in which a flat substrate is stacked on a flexible substrate. In this case, the flat substrate is connected to the flexible substrate using, for example, solder mounting, pressure bonding, or an adhesive layer.

Figure 10:
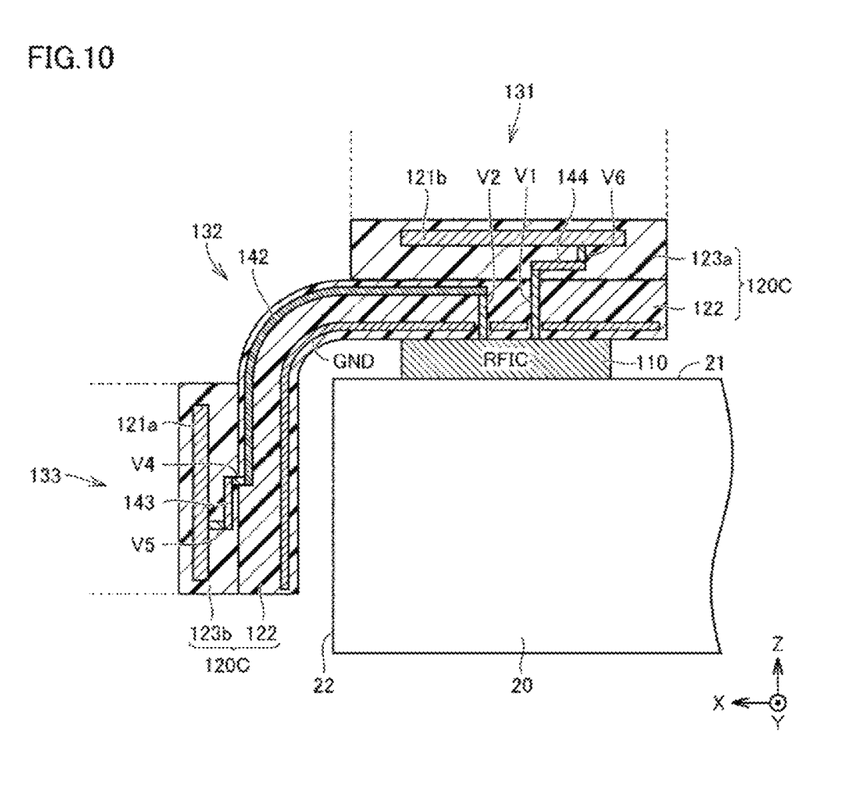
FIG. 10 is a transparent view (second view) of the inside of an antenna substrate.

FIG. 10 is a transparent view of the inside of an antenna substrate 120C according to Modification 2 from the positive Y-axis direction side. The antenna substrate 120C includes a flexible substrate 122, which extends across the entirety of the flat sections 131 and 133 and the flexible section 132, and flat substrates 123a and 123b, which are respectively stacked on regions of the flexible substrate 122 located in the flat sections 131 and 133.

The flat substrates 123a and 123b are, for example, each formed of a low-temperature co-fired ceramic (LTCC) multilayer substrate, a multilayer resin substrate formed by stacking a plurality of resin layers composed of a resin such as epoxy or polyimide, a multilayer resin substrate formed by stacking a plurality of resin layers composed of a liquid crystal polymer, a multilayer resin substrate formed by stacking a plurality of resin layers composed of a fluorine-based resin, a multilayer resin substrate formed by stacking a plurality of resin layers composed of a polyethylene terephthalate (PET) material, or a ceramic multilayer substrate other than LTCC. The flat substrates 123a and 123b do not necessarily have to have a multilayer structure and may instead be single layer substrates. Furthermore, the flat substrates 123a and 123b may be disposed on the side of the communication device 10 near the casing (including a display panel such as a liquid crystal panel).

Furthermore, in the flexible substrate 122, the conductor wires 142, which are composed of rolled copper foil, extend from the flexible section 132 to the flat section 131 and the flat section 133.

The radiating elements 121a, the conductor wires 143 composed of electrolytic copper foil, and the vias V5, which connect the radiating elements 121a and one end portions of the conductor wires 143 to each other, are disposed in the flat substrate 123b of the flat section 133. The other end portions of the conductor wires 143 are connected to one end portions of the conductor wires 142 disposed in the flexible substrate 122 by the vias V4. The other end portions of the conductor wires 142 are connected to the RFIC 110 by the vias V2 in the flat section 131. Thus, the radiating elements 121a are electrically connected to the RFIC 110.

The radiating elements 121b, the conductor wires 144 composed of electrolytic copper foil, and vias V6, which connect the radiating elements 121b and one end portions of the conductor wires 144 to each other, are disposed in the flat substrate 123a of the flat section 131. The other end portions of the conductor wires 144 are connected to the RFIC 110 by the vias V1. Thus, the radiating elements 121b are electrically connected to the RFIC 110.

Figure 11:
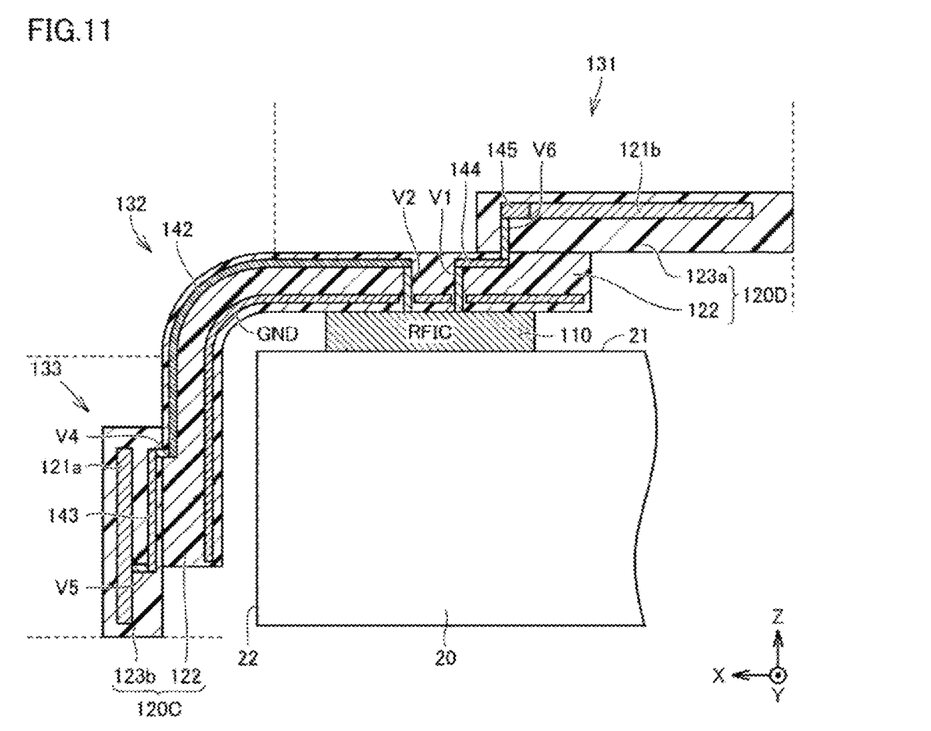
FIG. 11 is a transparent view (third view) of the inside of an antenna substrate.

FIG. 11 is a transparent view of the inside of another antenna substrate 120D according to Modification 2 from the positive Y-axis direction side. In the antenna substrate 120D, part of the flat substrate 123a is disposed so as to be shifted outward (negative X-axis direction side in FIG. 11) from one end portion of the flexible substrate 122 and part of the flat substrate 123b is disposed so as to be shifted outward (negative Z-axis direction side in FIG. 11) from the other end portion of the flexible substrate 122 with respect to the above-described antenna substrate 120C illustrated in FIG. 10. The flexible substrate 122 is connected to the flat surfaces of the flat substrates 123a and 123b using pressure bonding, adhesion, or connectors.

Furthermore, in the antenna substrate 120D, the conductor wires 144 in the flat section 131 are disposed in the flexible substrate 122 rather than in the flat substrate 123a and the radiating elements 121b and the vias V6 are connected to each other by conductor wires 145 composed of electrolytic copper foil inside the flat substrate 123a. The rest of the configuration of the antenna substrate 120D is the same as that of the antenna substrate 120C described above.

As described above, the flexible section 132 may be formed of a flexible substrate and the flat sections 131 and 133 may each have a multilayer structure consisting of a flexible substrate and a flat substrate. The "flexible substrate 122" and the "flat substrate 123b" of Modification 2 may respectively correspond to a "flexible substrate" and a "flat substrate" of the present disclosure.

The presently disclosed embodiments are illustrative in all points and should not be considered as limiting. The scope of the present disclosure is not defined by the above description of the embodiments but rather by the scope of the claims and it is intended that equivalents to the scope of the claims and all modifications within the scope of the claims be included within the scope of the disclosure.

REFERENCE SIGNS LIST 10 communication device, 20 mounting substrate, 21 main surface, 22 side surface, 100 antenna module, 111A to 113D, 117 switch, 112AR to 112DR low-noise amplifier, 112AT to 112DT power amplifier, 114A to 114D attenuator, 115A to 115D phase shifter, 116 signal multiplexer/demultiplexer, 118 mixer, 119 amplification circuit, 120, 120A, 120B antenna substrate, 121, 121a, 121b radiating element, 131, 133 flat section, 132 flexible section, 140, 141, 141B, 142, 142B, 143, 143B conductor wire, 200a, 200b manufacturing device, GND ground electrode, V1 to V5 vias.

The invention claimed is:

1. An antenna substrate comprising:
a flat section which has a plate shape and in which an antenna element is disposed;
a flexible section having a substantially uniform thickness that is shorter in width than length, the flexible section disposed adjacent to the flat section, and having flexibility;
a first electrical conductor that extends along an in-plane direction of the flat section and inside the flat section, the first electrical conductor has one end portion thereof connected to the antenna element, and has a polycrystalline structure; and
a second electrical conductor that extends along an in-plane direction of the flexible section and is disposed inside the flexible section, the second electrical conductor has one end portion thereof connected to another end portion of the first electrical conductor, and has a polycrystalline structure,
wherein an average or median particle size in an extension direction of the second electrical conductor is larger than an average or median particle size in an extension direction of the first electrical conductor, and an average or median value of a ratio of a particle size in the extension direction of the second electrical conductor to a particle size in a thickness direction of the second electrical conductor is larger than an average or median value of a ratio of a particle size in the extension direction of the first electrical conductor to a particle size in a thickness direction of the first electrical conductor.

2. The antenna substrate according to claim 1, wherein
the first electrical conductor and the second electrical conductor comprise copper foil.

3. The antenna substrate according to claim 1, wherein the flat section and the flexible section comprise a liquid crystal polymer.

4. The antenna substrate according to claim 3, wherein the first electrical conductor comprises electrolytic copper foil.

5. The antenna substrate according to claim 3, wherein the second electrical conductor comprises electrolytic copper foil.

6. The antenna substrate according to claim 1, wherein the flexible section being a portion of a flexible substrate, and
the flat section comprising a flat substrate and another portion of the flexible substrate, the flat substrate stacked on the another portion of the flexible substrate.

7. The antenna substrate according to claim 2, wherein the flexible section being a portion of a flexible substrate, and
the flat section comprising a flat substrate and another portion of the flexible substrate, the flat substrate stacked on the another portion of the flexible substrate.

8. The antenna substrate according to claim 4, wherein the flexible section being a portion of a flexible substrate, and
the flat section comprising a flat substrate and another portion of the flexible substrate, the flat substrate stacked on the another portion of the flexible substrate.

9. The antenna substrate according to claim 1, wherein at least one of the first electrical conductor or the second electrical conductor is a conductor wire.

10. The antenna substrate according to claim 2, wherein at least one of the first electrical conductor or the second electrical conductor is a conductor wire that comprises the copper foil.

11. The antenna substrate according to claim 3, wherein at least one of the first electrical conductor or the second electrical conductor is a conductor wire.

12. The antenna substrate according to claim 6, wherein at least one of the first electrical conductor or the second electrical conductor is a conductor wire.

* * * * *